(12) United States Patent
Yang et al.

(10) Patent No.: US 8,238,501 B2
(45) Date of Patent: Aug. 7, 2012

(54) BURST-MODE CLOCK AND DATA RECOVERY CIRCUIT USING PHASE SELECTING TECHNOLOGY

(75) Inventors: Ching Yuan Yang, Taichung (TW); Jung-Mao Lin, Taichung (TW); Yu-Min Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 827 days.

(21) Appl. No.: 12/266,530

(22) Filed: Nov. 6, 2008

(65) Prior Publication Data

US 2010/0040182 A1    Feb. 18, 2010

(30) Foreign Application Priority Data

Aug. 15, 2008 (TW) .............................. 97131222 A

(51) Int. Cl.
*H04L 7/033* (2006.01)
(52) U.S. Cl. ........................................ 375/355; 375/376
(58) Field of Classification Search .................. 375/355, 375/376
See application file for complete search history.

(56) References Cited

U.S. PATENT DOCUMENTS

| | | | |
|---|---|---|---|
| 6,850,580 B1 * | 2/2005 | Naoe ............................. | 375/355 |
| 7,010,074 B2 | 3/2006 | Nakamura | |
| 7,149,269 B2 | 12/2006 | Cranford, Jr. et al. | |
| 7,929,644 B2 * | 4/2011 | McCune, Jr. .................. | 375/326 |
| 2003/0161430 A1 * | 8/2003 | Sou ................................ | 375/376 |
| 2003/0227989 A1 * | 12/2003 | Rhee et al. ..................... | 375/376 |
| 2004/0202266 A1 | 10/2004 | Gregorius et al. | |
| 2005/0207520 A1 * | 9/2005 | Su et al. ......................... | 375/355 |
| 2006/0067440 A1 * | 3/2006 | Hsu et al. ....................... | 375/345 |
| 2007/0127614 A1 * | 6/2007 | Kawakami ..................... | 375/373 |
| 2010/0067633 A1 * | 3/2010 | Den Besten ................... | 375/373 |

FOREIGN PATENT DOCUMENTS

| | | |
|---|---|---|
| CN | 1518227 A | 8/2004 |
| TW | 200414699 | 8/2004 |

OTHER PUBLICATIONS

Article titled "A 0.5-μm CMOS 4.0-Gbit/s Serial Link Transceiver with Data Recovery Using Oversampling" authored by Ken et al., IEEE Journal of Solid-State Circuits, vol. 33. No. 5, May 1998, pp. 713-722.

(Continued)

*Primary Examiner* — Shuwang Liu
*Assistant Examiner* — David Huang
(74) *Attorney, Agent, or Firm* — Jianq Chyun IP Office

(57) ABSTRACT

A burst-mode clock and data recovery circuit using phase selecting technology is provided. In the data recovery circuit, a phase-locked loop (PLL) circuit is used for providing a plurality of fixed clock signals, each of which has a clock phase. An oversampling phase selecting circuit is coupled to the phase-locked loop circuit and used for detecting a data edge of a received data signal by using the clock signals and selects a clock phase to be locked according to the location of the data edge. A delay-locked loop (DLL) circuit is coupled to the phase-locked loop circuit and the oversampling phase selecting circuit, and used for comparing the data phase of the data signal with the clock phase of the selected clock signal, so as to delay the data phase of the data signal by a delay time until the data phase is locked as the clock phase.

21 Claims, 7 Drawing Sheets

OTHER PUBLICATIONS

"Office Action of Taiwan Counterpart Application", issued on Sep. 8, 2011, p. 1-p. 5, in which the listed references were cited.

"First Office Action of China Counterpart Application", issued on Jul. 11, 2011, p. 1-p. 5, in which the listed references were cited.

* cited by examiner

BURST-MODE CLOCK AND DATA RECOVERY CIRCUIT USING PHASE SELECTING TECHNOLOGY

CROSS-REFERENCE TO RELATED APPLICATION

This application claims the priority benefit of Taiwan application serial no. 97131222, filed on Aug. 15, 2008. The entirety of the above-mentioned patent application is hereby incorporated by reference herein and made a part of this specification.

BACKGROUND OF THE INVENTION

1. Field of the Invention

The present invention generally relates to a burst-mode clock and data recovery circuit using phase selecting technology.

2. Description of Related Art

With the growth of the wideband application, the need for the band width is raised. Optical fibers provide an extraordinary band width, good transmission quality and stability, which is a final solution for the wideband requirement. Currently, the most popular manner for achieving the scheme of optical fiber to home is through a low cost passive optical network (PON).

FIG. 1 is a schematic diagram illustrating a conventional passive optical network. Referring to FIG. 1, a passive optical network 100 comprises an optical line termination (OLT) 110, an optical distribution network (ODN) 120 and a plurality of optical network units (ONUs) 130. The optical line termination 110 is disposed at a head end and is able to be connected to an outside network for providing various network services such as internet, digital TV, high definition TV (HDTV) or voice over IP (VOIP). Those services are broadcasted to each of the optical network units 130 through the optical distribution network 120, such that users may pick up the desired service.

The optical distribution network 120 consists of an optical fiber and an optical splitter. The optical splitter is a passive element, which works without the need of power or maintenance. One end of the optical splitter is connected to the optical line termination 110 and the other end is connected to each of the optical network units 130. The optical splitter splits an optical signal sent by the optical line termination 110 into equal parts, distributes the same to each of the optical network units 130 connected therewith, and collects the signals uploaded by the optical network units 130 into the same optical fiber and transmits the same to the optical line termination 110. The optical network units 130 is usually disposed at a position close to a user end and classified into schemes such as fiber to the home (FTTH), fiber to the building (FTTB), or fiber to the curb (FTTC) according to different disposing position. Once a user intends to upload information such as a file transfer protocol (FTP) file or a video conference, the information can be uploaded through the optical network units 130.

Since the passive optical network adopts a point to multipoint structure, the uploaded data is collected in the same optical fiber by the optical splitter. Accordingly, the data to be uploaded by the optical network units 130 is transmitted through a time division multiplexing (TDM) manner based on IEEE 802.3ah and ITU G.983/G.984. The optical network units 130 can only upload data in a time slot arranged for the optical line termination 110, and the phases of data that the optical network units 130 upload to the optical line termination 110 are not all the same. Moreover, since the uploaded data of multiple user ends is uploaded through a time division multiplexing manner and each user may use a single optical fiber channel in its own time slot, the time for transmitting data by each user end can be reduced largely. Upon such circumstance, if the recovery process is executed by the conventional data recovery circuit, an effectiveness of bandwidth usage is wasted because the time for lock and recovery is too long and the time for the user to upload data is reduced in such structure. Accordingly, for the burst-mode data transmission process, a burst-mode receiver is required to be disposed in the optical line termination 110 to fast recover the clock and phase of the received data so as to use the bandwidth more effectively.

The conventional data recovery circuits with continuous mode can be classified into two types, in which the first type is a data recovery circuit based on a phase-locked loop. FIG. 2 is a schematic diagram of a conventional data recovery circuit based on a phase-locked loop. Referring to FIG. 2, a data recovery circuit 200 includes a phase frequency detector 210, a loop filter 220, and a voltage control oscillator (VCO) 230. The locking manner of the data recovery circuit 200 is to compare a phase and a frequency of a clock generated by the voltage control oscillator 230 with those of input data. When a difference of the phase and the frequency is occurred, a frequency of the voltage control oscillator 230 is changed by a control signal. When a difference of the phase and the frequency is not occurred, the data recovery circuit 200 reaches a stable locked state.

The second type is a data recovery circuit using double loops. FIG. 3 is a schematic diagram of a data recovery circuit using double loops. Referring to FIG. 3, a data recovery circuit 300 includes a phase frequency detector 310, a loop filter 320, a voltage control oscillator 330, a phase detector 340, a loop filter 350, and a voltage control delay line (VCDL) 360. The locking manner of the data recovery circuit 300 is to compare a phase and a frequency of a clock signal generated by an external reference clock and a voltage control oscillator 330 on an upper side with those of input data, so as to generate a stable output clock for the delay-locked loop on a downer side. When the data enters the data recovery circuit 300, the phase instead of the frequency thereof is compared with that of a clock signal with fixed frequency. When no phase difference is occurred, the data recovery circuit 300 reaches a stable locked state.

To create a data recovery circuit having characteristic of fast locking, a burst-mode clock of oversampling is required. The oversampling is to use clock signals with same frequency and different phase to sample the data, respectively. FIG. 4 is a schematic diagram illustrating a conventional three-times oversampling process. Referring to FIG. 4, three clock signals are used for sampling the data respectively, which is called three-times oversampling. For the data state sampled by the three clock signals, the states of each two of them are calculated through an XOR operation and which two adjacent clock signals that the data edge is positioned between are obtained after calculation and voting of a digital circuit.

For example, FIG. 5 is a schematic diagram illustrating a conventional phase selecting method. Referring to FIG. 5, the data edge is appeared between the clock signals #0 and #2, and therefore the clock signal #1 can be selected and used as the clock signal for data recovery. When performing phase selection, the oversampling phase selecting circuit may determine the sampling clock through the selection of the digital circuit, which is suitable for applications of fast locking. However, such a structure still lacks the capability for eliminating phase difference in the circuit. When a number of the data jitter is increased, the sampled phase may be incorrect so as to cause an error on data recovery.

SUMMARY OF THE INVENTION

The present invention relates to a burst-mode clock and data recovery circuit using phase selecting technology, in which characteristics of fast selection of a sampler and stability of a delay-locked loop are combined to increase the speed and stability for phase locking.

The present invention provides a burst-mode clock and data recovery circuit using phase selecting technology, which comprises a phase-locked loop circuit, an oversampling phase selecting circuit, and a delay-locked loop circuit. The phase-locked loop circuit is used for providing a plurality of fixed clock signals, each of which comprises a clock phase. The oversampling phase selecting circuit is coupled to the phase-locked loop circuit for using the clock signals to detect a data edge of received data signal and selecting the clock phase to be locked to according to the position of the data edge. The delay-locked loop circuit is coupled to the phase-locked loop circuit and the oversampling phase selecting circuit for comparing a data phase of the data signal with the clock phase to be locked to so as to control the data phase of the data signal to be delayed for a delay time period until the data phase is locked to the clock phase.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
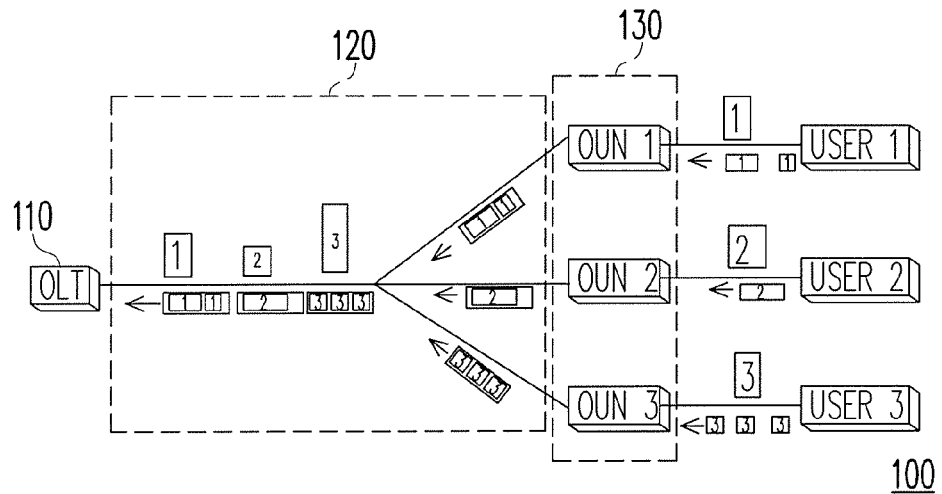
FIG. 1 is a schematic diagram illustrating a conventional passive optical network.
Figure 2:
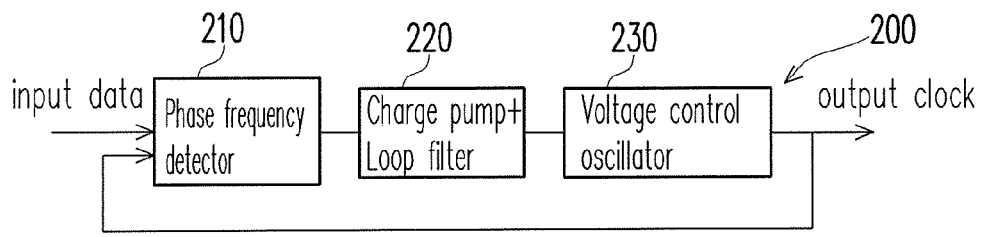
FIG. 2 is a schematic diagram of a conventional data recovery circuit based on a phase-locked loop.
Figure 2:
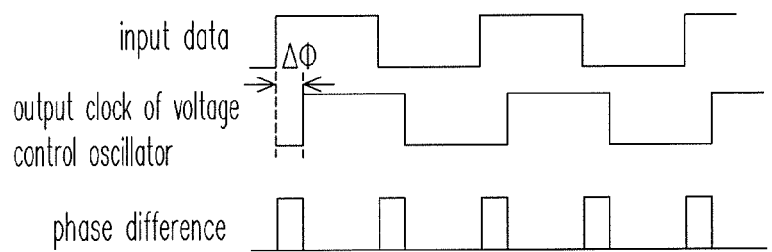
Figure 3:
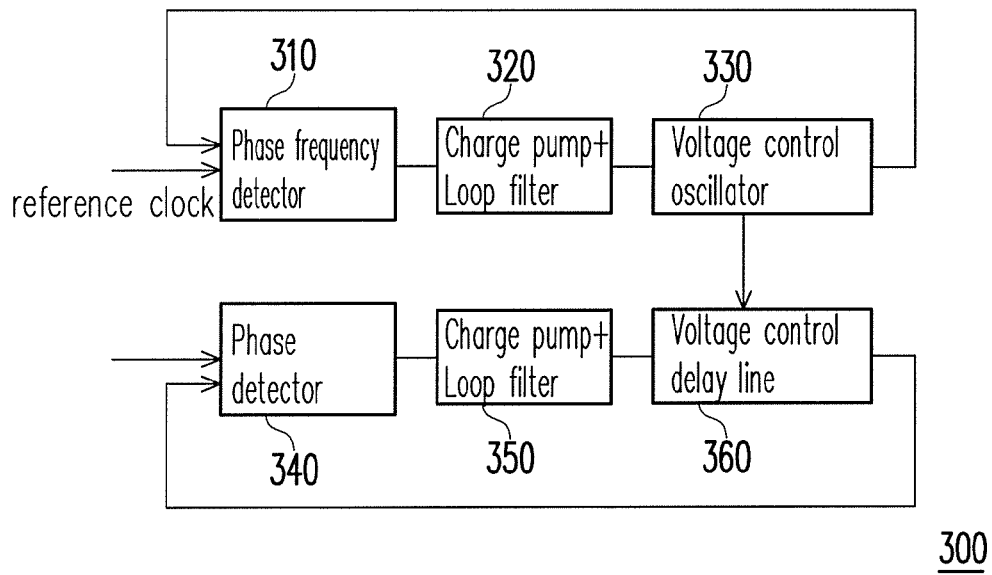
FIG. 3 is a schematic diagram of a data recovery circuit using double loops.
Figure 4:
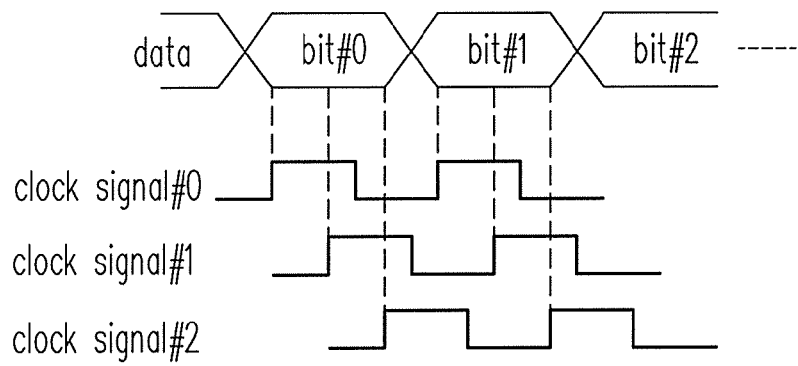
FIG. 4 is a schematic diagram illustrating a conventional three-times oversampling process.
Figure 5:
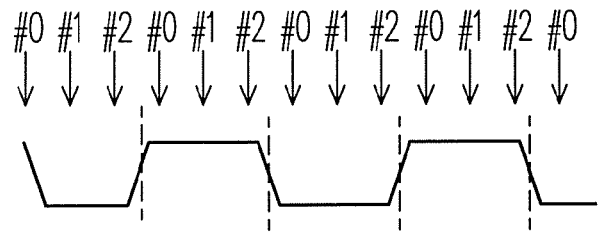
FIG. 5 is a schematic diagram illustrating a conventional phase selecting method.

Reference will now be made in detail to the present preferred embodiments of the invention, examples of which are illustrated in the accompanying drawings. Wherever possible, the same reference numbers are used in the drawings and the description to refer to the same or like parts.

The present invention combines advantages of an oversampling phase selecting circuit and a delay-locked loop (DLL). First, characteristic of fast speed of the oversampling phase selecting circuit is used to fit the speed requirement of a burst-mode and clock and data recovery (CDR) circuit, and then characteristic of stability of the delay-locked loop is combined, such that the data recovery circuit of the present invention not only has capability for fast locking, but also has the stability of the delay-locked loop. Embodiments of the present invention will be described below with reference to accompanying drawings.

Figure 6:
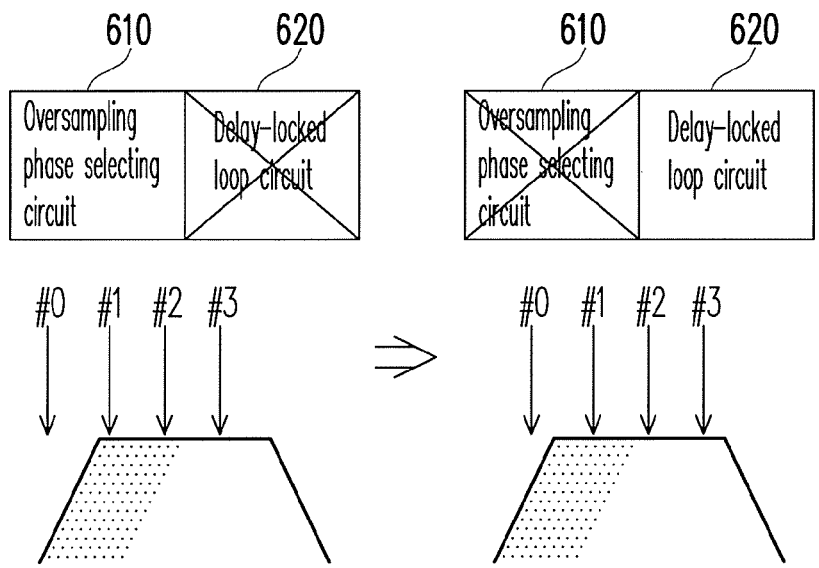
FIG. 6 is a schematic diagram illustrating an operation of a circuit according to an embodiment of the present invention.

In the present invention, a delay-locked loop circuit is disposed behind an oversampling phase selecting circuit for performing phase alignment so as to eliminate a phase difference there between. FIG. 6 is a schematic diagram illustrating an operation of a circuit according to an embodiment of the present invention. Referring to FIG. 6, when data enters the data recovery circuit, an oversampling phase selecting circuit 610 starts to search for an data edge of a data signal so as to perform phase selection. When the position of the data edge is determined, the data recovery circuit terminates the working state of the oversampling phase selecting circuit 610 and transforms the same into a delay-locked loop circuit 620, in which a phase of the data signal is directly aligned with that of a home clock signal when the data signal enters the data recovery circuit. Through the transformation between the two working states, a burst-mode clock and data recovery circuit having characteristics of fast locking and stability is created.

Figure 7:
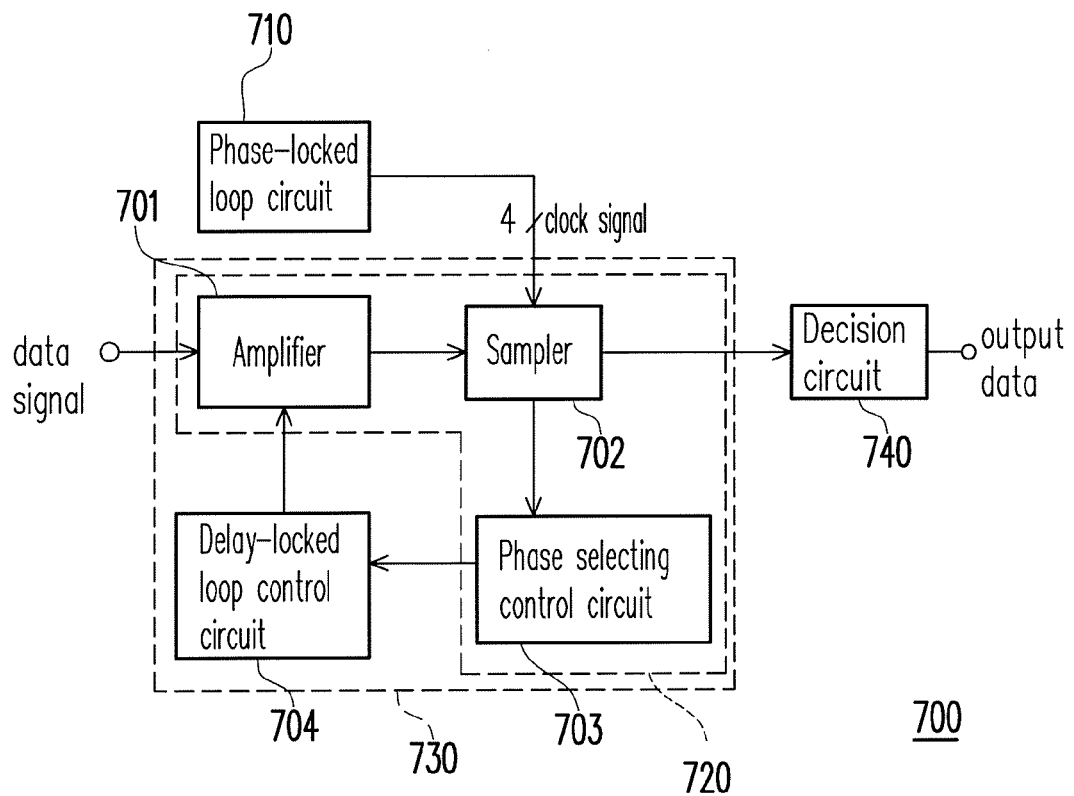
FIG. 7 is a block diagram of a data recovery circuit according to an embodiment of the present invention.

FIG. 7 is a block diagram of a data recovery circuit according to an embodiment of the present invention. Referring to FIG. 7, in the data recovery circuit 700 of the present embodiment, a phase-locked loop (PLL) circuit 710 is used for generating a plurality of fixed clock signals and providing the same to the lower circuit, in which each of the clock signals has a fixed clock phase. The lower circuit can be divided into an oversampling phase selecting circuit 720 and a delay-locked loop circuit 730 for explanation.

In the oversampling phase selecting circuit 720, an amplitude of the data signal is amplified by an amplifier 701 and a state of the data signal is sampled by a sampler 702. The sampler 702 performs, for example, three-times oversampling, four-times oversampling, or other types of oversampling larger than three-times, but not limited thereto. A sampling result of the sampler 702 is given to a phase selecting control circuit 703 for determining a position of the data edge, selecting a clock phase to be locked to by the locked loop circuit 730, and using the same as a loop selection used by the delay-locked loop circuit 730. The amplifier 701 comprises a preamplifier (PreAmp) and a voltage control delay line, in which the preamplifier is used for amplifying an amplitude of the data signal and the voltage control delay line is used for delaying a phase of the data signal.

The delay-locked loop circuit 730 consists of the amplifier 701, the sampler 702, a phase detector (PD) selected by the phase selecting control circuit 703, and a delay-locked loop control circuit 704. Based on a result of phase comparison generated by the phase detector and the digital circuit, the delay-locked loop control circuit 704 controls the delay time of the voltage control delay line in the amplifier 701 so as to reach a goal of locking. Finally, when the data phase of the data signal is aligned with the clock phase, the decision circuit 740 outputs the data signal whose phase has been adjusted. In the following, an operation of phase selection is regarded as a rough adjustment and an operation of phase-locked is regarded as a fine adjustment, and two embodiments are given below for explaining the detail of these two operations.

Figure 8:
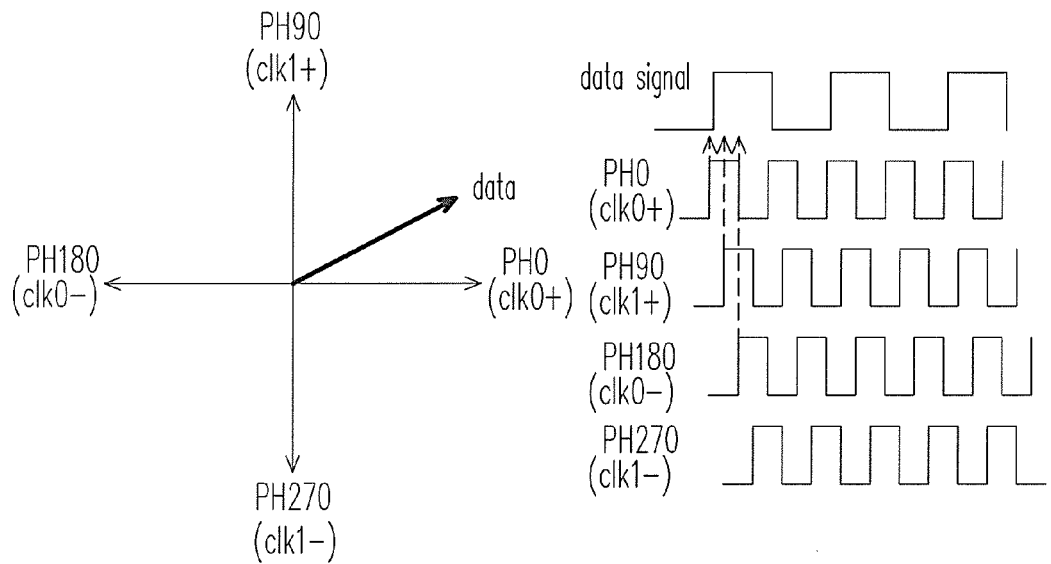
FIG. 8 is a schematic diagram and a clock diagram illustrating phase relation between the clock signal and the data signal according to an embodiment of the present invention.
Figure 9:
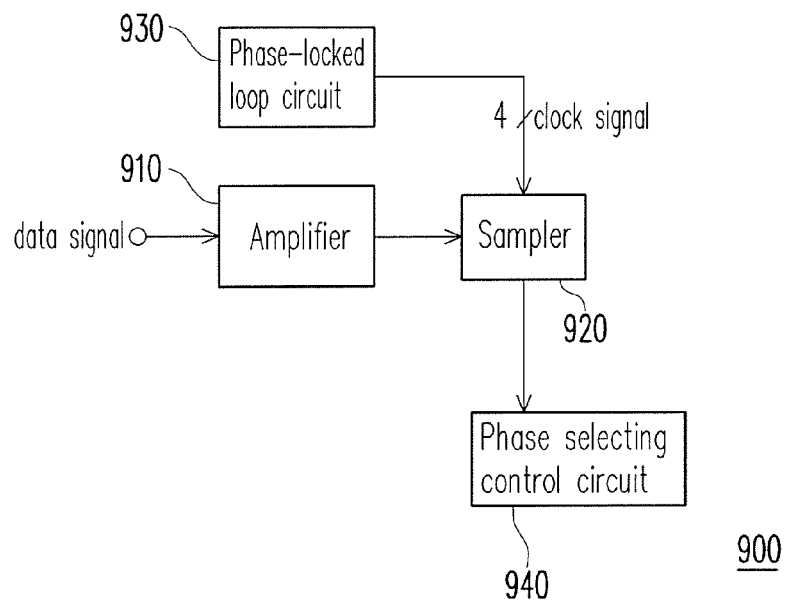
FIG. 9 is a block diagram of an oversampling phase selecting circuit according to an embodiment of the present invention.

For the part of rough adjustment, FIG. 8 is a schematic diagram and a clock diagram illustrating phase relation between the clock signal and the data signal according to an embodiment of the present invention. FIG. 9 is a block diagram of an oversampling phase selecting circuit according to an embodiment of the present invention. Referring to FIG. 8 and FIG. 9, when the data signal enters the oversampling phase selecting circuit 900, the amplifier 910 first amplifies an amplitude of the data signal, and then the sampler 920 uses the clock signal generated by the phase-locked loop circuit 930 to sample a state of the data signal. Afterwards, the phase selecting control circuit 940 determines two clock signals that a data edge is fallen between according to the sampled data state. After a certain amount of votes, an interval to be selected is determined.

As shown in FIG. 8, the present embodiment takes a four-times oversampling as an example. The phase-locked loop circuit 930 provides four sets of clock signals PH0, PH90, PH180, and PH270, which have different phases. Assuming the data edge is fallen between the clock signals PH0 and PH90, after the oversampling phase selecting circuit 900 determines the position of the data edge, it selects the clock signal PH90 as a target for the delay-locked loop circuit to align the data phase.

Accordingly, in the aforesaid rough adjustment process, the oversampling phase selecting circuit 900 determines the position of the data edge and the loop path of the delay-locked loop circuit, that is, it selects the clock phase that the data phase is locked to. On the other hand, when the data signal enters the oversampling phase selecting circuit 900, the amplifier 910 amplifies the amplitude of the data signal first without affecting the process of phase selection. The sampler 920 then samples a state of the data signal in the amplified data and the phase selecting control circuit 940 calculates a sampling result, so as to complete the process of phase selection.

Figure 10:
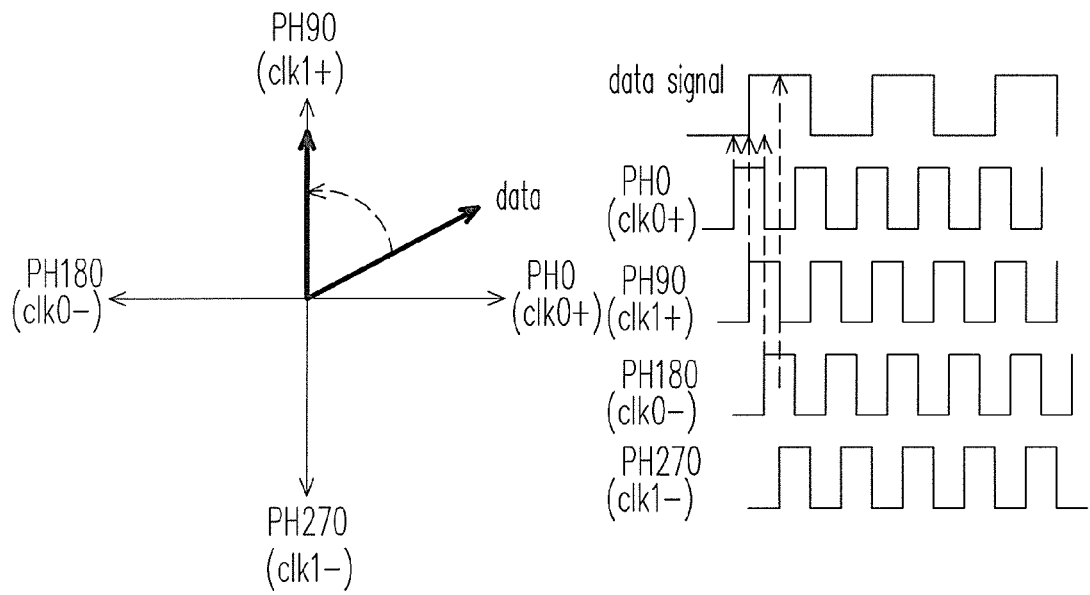
FIG. 10 is a schematic diagram and a clock diagram illustrating phase relation between the clock signal and the data signal according to an embodiment of the present invention.
Figure 11:
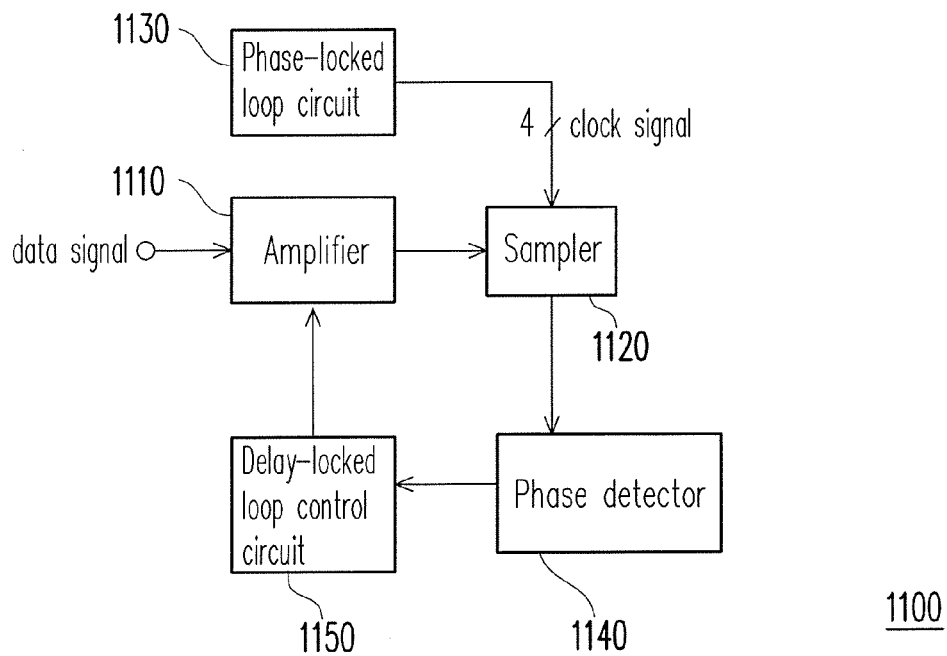
FIG. 11 is a block diagram of a delay-locked loop circuit according to an embodiment of the present invention.

For the part of fine adjustment, FIG. 10 is a schematic diagram and a clock diagram illustrating phase relation between the clock signal and the data signal according to an embodiment of the present invention. FIG. 11 is a block diagram of a delay-locked loop circuit according to an embodiment of the present invention. Referring to FIG. 10 and FIG. 11, after the path of the delay-locked loop is selected and the data phase is locked to the clock phase, the process of phase alignment is continued.

As shown in FIG. 10, if the position of the data edge is determined falling between the clock signals PH0 and PH90, the clock phase PH90 is used as the clock phase that the data phase is locked to. When the delay-locked loop circuit 1100 starts to work, the data phase is moved to the clock phase PH90 gradually until the phase thereof is aligned with that of the clock phase PH90. Accordingly, the purpose of phase locking is achieved.

In the process of fine adjustment, when the data signal enters the delay-locked loop circuit 1100, the preamplifier of the amplifier 1110 amplifies the data signal first and then the sampler 1120 uses the clock signal generated by the phase-locked loop circuit 1130 to sample the amplified data signal and outputs a sampling result to phase detectors of the phase selecting control circuit 1140, which determines whether the phase of the clock is advanced or delayed so as to determine whether the delay-locked loop control circuit 1150 performs a phase advancing or delaying control to the voltage control delay line of the amplifier 1110. Accordingly, the data phase of the data signal can be adjusted gradually to align with the clock phase of the clock signal until it is locked.

Figure 12:
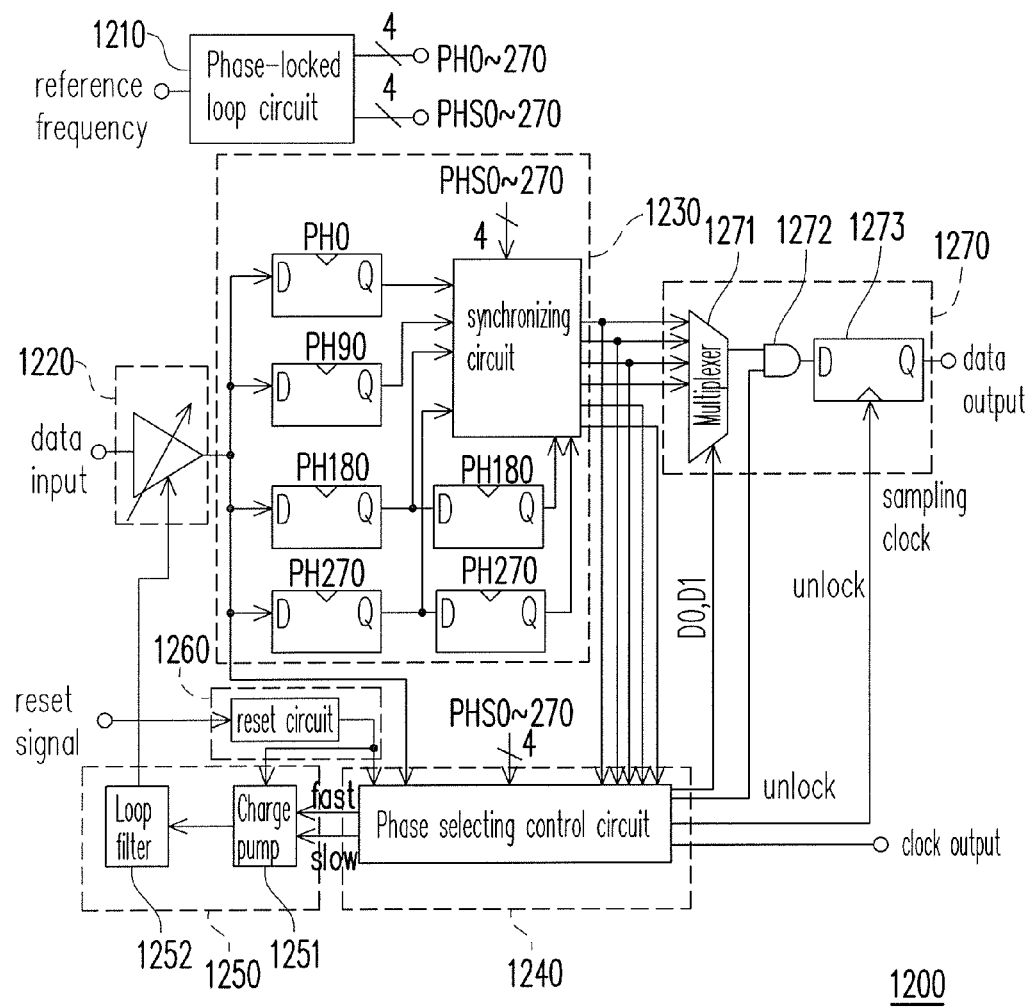
FIG. 12 is a block diagram of a data recovery circuit according to an embodiment of the present invention.

FIG. 12 is a block diagram of a data recovery circuit according to an embodiment of the present invention. Referring to FIG. 12, the present embodiment illustrates a detailed circuit structure of the data recovery circuit in FIG. 7. The data recovery circuit 1200 includes a phase-locked loop circuit 1210, an amplifier 1220, a sampler 1230, a phase selecting control circuit 1240, a delay-locked loop control circuit 1250, a reset circuit 1260, and a decision circuit 1270, and the functions thereof are described as follows.

The phase-locked loop circuit 1210 provides a plurality sets of fixed clock signals including PH0, PH90, PH180, PH270, and PHS0, PHS90, PHS180, PHS270. Each set of the clock signals has a fixed clock phase. The amplifier 1220 includes a preamplifier and a voltage control delay line, in which the preamplifier is used for amplifying an amplitude of the data signal and the voltage control delay line is used for delaying a phase of the data signal.

The sampler 1230 consists of six D-type flip-flops and a synchronizing circuit and uses the clock signals PH0, PH90, PH180, and PH270 provided by the phase-locked loop circuit 1210 and the last two clock signal PH180' and PH270' of last clock period to sample the data signal, so as to detect the data edge of the data signal. The data sampling result is synchronized by the synchronizing circuit and then sent to the rear phase selecting control circuit 1240.

The phase selecting control circuit 1240 uses the phase detectors thereof to compare the phase state of the sampled data signal to select a data edge closest to the clock phase and use the same as a target that the delay-locked loop circuit 1250 is locked to.

In detail, when the synchronizing data is entered, the phase selecting control circuit 1240 uses different clock phases to sample and synchronize the data signal and output the result, which is used to determine a state of data signal. If a state difference is determined, it can be used to derive the result that the sampler 1230 samples the data signal so as to find the position of the data edge.

The phase selecting control circuit 1240 actually uses former three and later three data sampling results after the data is sampled and synchronized as the reference to determine the data state when determining the phase interval. If the states of the synchronized data PH0 and PH90 are different, it can be derived that when sampling the data signal with the clock signal, the sampled data states of the clock signals clk0 and clk90 are different, such that the data edge is occurred between the clock signals clk0 and clk90.

The delay-locked loop circuit 1250 uses the selected phase detector in the phase selecting control circuit 1240 to compare with the clock signal in phase and controls the charge pump 1251 of the delay-locked loop control circuit 1250 to provide a current for charging or discharging the loop filter 1252, so as to change the control voltage of the voltage control delay line in the amplifier 1220. Through repeated sampling and delay locking processes, finally the data phase of the data signal can be aligned with the selected clock phase so as to achieve the purpose of phase locking.

The reset circuit 1260 is connected to a voting circuit and an unlocking circuit in the phase selecting control circuit 1240 and a charge pump 1251 in the delay-locked loop circuit 1250. Before the data enters the circuit, the reset circuit 1260 clears the output states of the voting circuit and the unlocking circuit and waits for the data being input so as to start counting. In the meantime, the reset circuit 1260 also resumes an output voltage level of the charge pump 1251 back to a preset voltage and waits for the control signal to charge or discharge the loop filter 1252.

The decision circuit 1270 includes a multiplexer 1271 for selecting data to be output and an AND gate 1272 for outputting control time. Finally, after being sampled by the D-type flip-flop 1273, the data is output so as to complete the clock and data recovery.

It should be noted herein that, in the structure of aforesaid data recovery circuit 1200, a part of electronic elements in the oversampling phase selecting circuit and the delay-locked loop circuit including the phase-locked loop circuit 1210, the amplifier 1220, the sampler 1230, and the phase selecting control circuit 1240 are overlapped. The difference is on that the oversampling phase selecting circuit only uses the preamplifier in the amplifier 1220 to amplify the amplitude of the data signal, and the delay-locked loop circuit further uses the voltage control delay line in the amplifier 1220 to delay the phase of the data signal.

Besides, the oversampling phase selecting circuit uses the phase selecting control circuit 1240 to select the phase detectors to be used in the delay-locked loop circuit and also determines the clock phase to be locked to. One embodiment is given below for detailed illustration.

Figure 13:
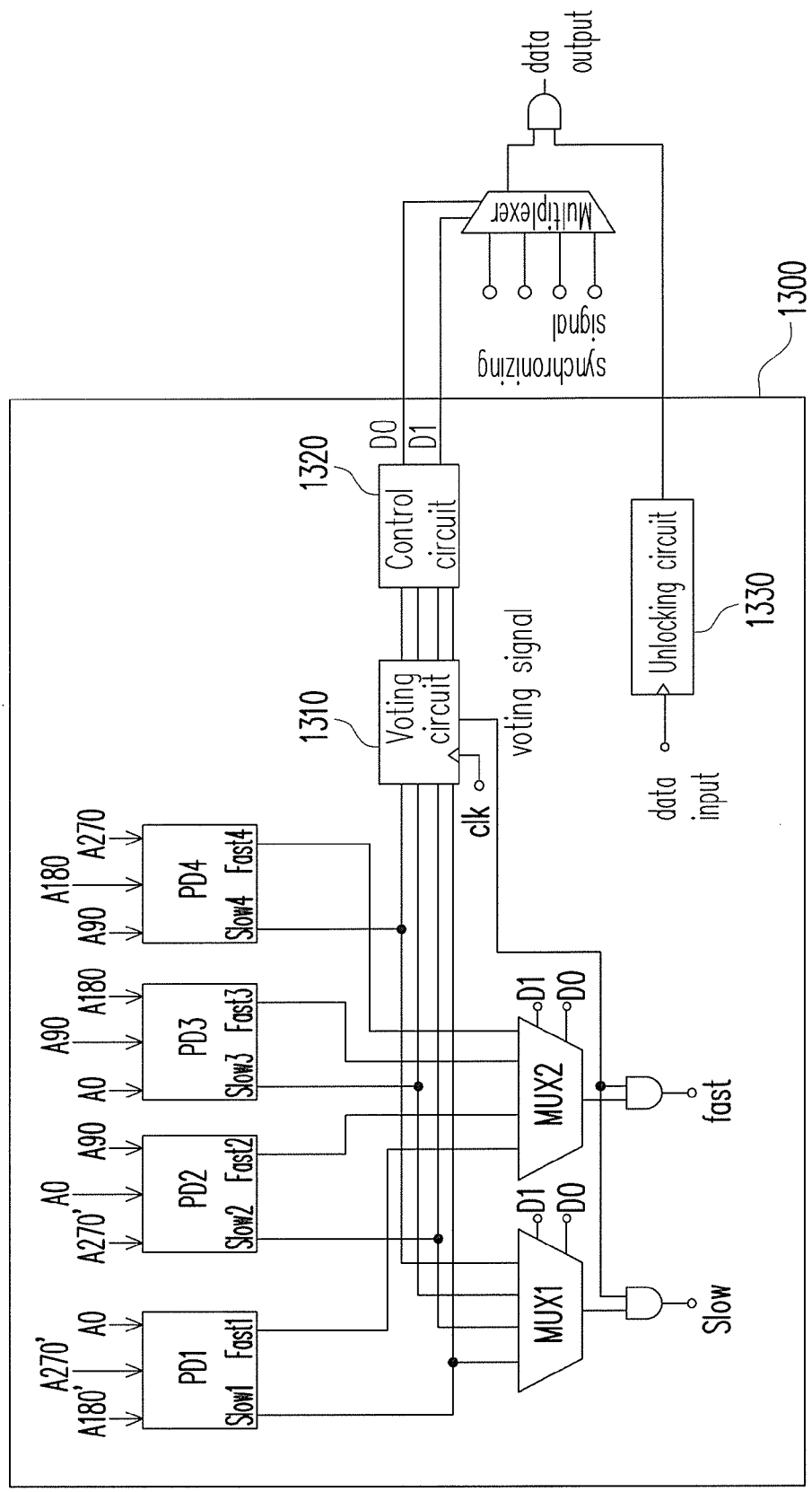
FIG. 13 is a circuit diagram of a phase selecting control circuit and phase detectors according to an embodiment of the present invention.

FIG. 13 is a circuit diagram of a phase selecting control circuit and phase detectors according to an embodiment of the present invention. Referring to FIG. 13, when a data recovery circuit operates in a working state of oversampling phase selection, the phase detectors PD1~PD4 in the phase selecting control circuit 1300 are respectively used for detecting the state of the data signal, so as to determine which two clock signals that the data edge is fallen between. The voting circuit 1310 then counts a number of times and stops counting when the determination is ended. In the meantime, the control circuit 1320 controls the multiplexers MUX1 and MUX2 to select a phase detector from the four phase detectors PD1~PD4 for being used in the delay-locked loop.

When the state is cleared by the reset circuit, the unlocking circuit 1330 waits for data input. After the data enters the circuit, the unlocking circuit 1330 starts counting the number of data and generates a control signal so as to output the recovered data when the counted number of data reaches a preset output number of data.

When the data recovery circuit operates in the delay-locked loop mode, the selected phase detector uses its properties to determine the data state of the result of clock sampling is before or behind the clock to be locked to, so as to output a corresponding control signal for the following delay-locked loop control circuit (not shown) to adjust the delay time.

To sum up, the present invention provides a the burst-mode clock and data recovery circuit using phase selecting technology, in which a three-times oversampling phase selecting circuit is used for fast selecting the position of the data phase and determining a path of the delay-locked loop and then the delay-locked loop is used for performing phase locking. The characteristic of fast speed of the oversampling phase selecting circuit meets the requirement of the burst-mode clock and data recovery circuit, and the characteristic of stability of the delay-locked loop may help the data recovery circuit to lock the data phase of the data signal precisely and quickly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A burst-mode clock and data recovery circuit using phase selecting technology, comprising:
   a phase-locked loop circuit for providing a plurality of fixed clock signals, each of which comprises a clock phase;
   an oversampling phase selecting circuit, coupled to the phase-locked loop circuit, for using the clock signals to detect a data edge of received data signal by counting a number of times that the data edge of the data signal falls between two of the fixed clock signals, and selecting the clock phase to be locked according to the position of the data edge, wherein the oversampling phase selecting circuit comprises:
   an amplifier for amplifying the received data signal;
   a sampler, coupled to the amplifier, for sampling a state of the data signal using the clock signals; and
   a phase selecting control circuit, coupled to the sampler, for determining the data edge of the data signal according to the state sampled by each of the clock signals and selecting the clock phase to be locked by the delay-locked loop circuit, wherein the phase selecting control circuit comprises:
   a plurality of phase detectors, each of which receives one of the data signal and the clock signals, for determining the two clock signals which the data edge of the data signal is fallen between;
   a voting circuit, coupled to the phase detector, for counting the number of times that the data edge of the data signal falls between the clock signals of the phase detectors, so as to obtain a voting result; and
   a control circuit, coupled to the voting circuit, for selecting one of the phase detectors and using the same as the phase detector to be used by the delay-locked loop circuit according to the voting result; and
   a delay-locked loop circuit, coupled to the phase-locked loop circuit and the oversampling phase selecting circuit, for comparing a data phase of the data signal with the clock phase to be locked so as to control the data phase of the data signal to be delayed for a delay time period until the data phase is locked to the clock phase.

2. The burst-mode clock and data recovery circuit using phase selecting technology according to claim 1, further comprising:
   a decision circuit, coupled to the delay-locked loop circuit, for selecting and outputting the data signal corresponding to the clock phase according to the clock phase-locked by the delay-locked loop circuit.

3. The burst-mode clock and data recovery circuit using phase selecting technology according to claim 2, wherein the decision circuit comprises selecting the clock signal farthest from the data edge and outputting the data signal using the clock phase of the clock signal.

4. The burst-mode clock and data recovery circuit using phase selecting technology according to claim 1, wherein the sampler comprises:
   a plurality of flip-flops, each of which is coupled to one of the clock signals output by the phase-locked loop circuit, for sampling the data signal; and
   a synchronizing circuit, coupled to the flip-flops, for synchronizing a sampling result of the flip-flops and outputting the sampling result to the phase selecting control circuit.

5. The burst-mode clock and data recovery circuit using phase selecting technology according to claim 1, wherein the phase selecting control circuit further comprises:

an unlocking circuit for receiving the data signals and counting a number of data of the data signals so as to generate a control signal and output the recovered data.

6. The burst-mode clock and data recovery circuit using phase selecting technology according to claim 5, wherein the oversampling phase selecting circuit further comprises:
a reset circuit, coupled to the voting circuit and the unlocking circuit, for clearing the output state of the voting circuit and the unlocking circuit, after which the voting circuit and the unlocking circuit start to count the number of times that the clock signal of each of the phase detectors falls between the data edge of the data signal.

7. The burst-mode clock and data recovery circuit using phase selecting technology according to claim 1, wherein the phase selecting control circuit selects one of the two clock signals closest to the data edge and using the clock phase of the selected clock signal as the clock phase to be locked by the delay-locked loop circuit.

8. The burst-mode clock and data recovery circuit using phase selecting technology according to claim 7, wherein the phase selecting control circuit comprises selecting the clock signal behind the data edge and closest to the data edge.

9. The burst-mode clock and data recovery circuit using phase selecting technology according to claim 1, wherein the delay-locked loop circuit comprises:
the amplifier for amplifying the received data signal;
the sampler, coupled to the amplifier, for sampling a state of the data signal using the selected clock signal;
a phase detector, coupled to the sampler, for determining whether the phase of the clock phase is advanced or delayed so as to output a control signal; and
a delay-locked loop control circuit, coupled to the phase detector, for controlling a delay time period of the amplifier for the data phase until the data phase is locked to the clock phase.

10. The burst-mode clock and data recovery circuit using phase selecting technology according to claim 9, wherein the amplifier comprises:
a preamplifier for amplifying the received data signal; and
a voltage control delay line, coupled to the preamplifier, for delaying the data phase of the data signal by the delay time period.

11. The burst-mode clock and data recovery circuit using phase selecting technology according to claim 10, wherein the amplifier comprises:
a charge pump for providing a current according to the control signal; and
a loop filter, coupled to the charge pump, for receiving the current to perform charging and discharging and outputting a control voltage to the voltage control delay line to change the delay time period of the voltage control delay line.

12. The burst-mode clock and data recovery circuit using phase selecting technology according to claim 1, wherein the oversampling phase selecting circuit comprises performing three-times oversampling or four-times oversampling on the data signal.

13. A burst-mode clock and data recovery circuit using phase selecting technology, comprising:
a phase-locked loop circuit for providing a plurality of fixed clock signals, each of which comprises a clock phase;
an oversampling phase selecting circuit, coupled to the phase-locked loop circuit, for using the clock signals to detect a data edge of received data signal by counting a number of times that the data edge of the data signal falls between two of the fixed clock signals, and selecting the clock phase to be locked according to the position of the data edge, the oversampling phase selecting circuit comprises:
an amplifier for amplifying the received data signal;
a sampler, coupled to the amplifier, for sampling a state of the data signal using the clock signals; and
a phase selecting control circuit, coupled to the sampler, for determining the data edge of the data signal according to the state sampled by each of the clock signals and selecting the clock phase to be locked by the delay-locked loop circuit; and
a delay-locked loop circuit, coupled to the phase-locked loop circuit and the oversampling phase selecting circuit, for comparing a data phase of the data signal with the clock phase to be locked so as to control the data phase of the data signal to be delayed for a delay time period until the data phase is locked to the clock phase, the delay-locked loop circuit comprises:
the amplifier for amplifying the received data signal;
the sampler, coupled to the amplifier, for sampling a state of the data signal using the selected clock signal;
a phase detector, coupled to the sampler, for determining whether the phase of the clock phase is advanced or delayed so as to output a control signal; and
a delay-locked loop control circuit, coupled to the phase detector, for controlling a delay time period of the amplifier for the data phase until the data phase is locked to the clock phase.

14. The burst-mode clock and data recovery circuit using phase selecting technology according to claim 13, further comprising:
a decision circuit, coupled to the delay-locked loop circuit, for selecting and outputting the data signal corresponding to the clock phase according to the clock phase-locked by the delay-locked loop circuit.

15. The burst-mode clock and data recovery circuit using phase selecting technology according to claim 14, wherein the decision circuit comprises selecting the clock signal farthest from the data edge and outputting the data signal using the clock phase of the clock signal.

16. The burst-mode clock and data recovery circuit using phase selecting technology according to claim 13, wherein the sampler comprises:
a plurality of flip-flops, each of which is coupled to one of the clock signals output by the phase-locked loop circuit, for sampling the data signal; and
a synchronizing circuit, coupled to the flip-flops, for synchronizing a sampling result of the flip-flops and outputting the sampling result to the phase selecting control circuit.

17. The burst-mode clock and data recovery circuit using phase selecting technology according to claim 13, wherein the phase selecting control circuit selects one of the two clock signals closest to the data edge and using the clock phase of the selected clock signal as the clock phase to be locked by the delay-locked loop circuit.

18. The burst-mode clock and data recovery circuit using phase selecting technology according to claim 17, wherein the phase selecting control circuit comprises selecting the clock signal behind the data edge and closest to the data edge.

19. The burst-mode clock and data recovery circuit using phase selecting technology according to claim 13, wherein the amplifier comprises:
a preamplifier for amplifying the received data signal; and
a voltage control delay line, coupled to the preamplifier, for delaying the data phase of the data signal by the delay time period.

20. The burst-mode clock and data recovery circuit using phase selecting technology according to claim 19, wherein the amplifier comprises:
- a charge pump for providing a current according to the control signal; and
- a loop filter, coupled to the charge pump, for receiving the current to perforin charging and discharging and outputting a control voltage to the voltage control delay line to change the delay time period of the voltage control delay line.

21. The burst-mode clock and data recovery circuit using phase selecting technology according to claim 13, wherein the oversampling phase selecting circuit comprises performing three-times oversampling or four-times oversampling on the data signal.

* * * * *